(12) United States Patent
Decams et al.

(10) Patent No.: US 7,608,299 B2
(45) Date of Patent: Oct. 27, 2009

(54) PROCESS FOR THE DEPOSITION BY CVD OF A SILVER FILM ON A SUBSTRATE

(75) Inventors: Jean-Manuel Decams, Montpellier (FR); Hervé Guillon, Montpellier (FR); Pascal Doppelt, Noisy-le-Sec (FR)

(73) Assignees: Centre National de la Recherche Scientifique, Paris (FR); Qualiflow Therm, Montpellier Cedex (FR)

( * ) Notice: Subject to any disclaimer, the term of this patent is extended or adjusted under 35 U.S.C. 154(b) by 0 days.

(21) Appl. No.: 10/550,459

(22) PCT Filed: Mar. 19, 2004

(86) PCT No.: PCT/FR2004/000678
§ 371 (c)(1),
(2), (4) Date: Dec. 12, 2006

(87) PCT Pub. No.: WO2004/087988
PCT Pub. Date: Oct. 14, 2004

(65) Prior Publication Data
US 2007/0148345 A1    Jun. 28, 2007

(30) Foreign Application Priority Data
Mar. 25, 2003    (FR) .................................. 03 03613

(51) Int. Cl.
*C23C 16/00*    (2006.01)

(52) U.S. Cl. ............... 427/248.1; 427/250; 427/255.23; 427/255.28

(58) Field of Classification Search ............... 427/248.1, 427/250, 255.23
See application file for complete search history.

(56) References Cited

U.S. PATENT DOCUMENTS

| 4,703,028 | A  | * | 10/1987 | Steininger | .................. | 502/178 |
| 5,722,184 | A  | * | 3/1998  | Onoe et al. | .................. | 34/586 |
| 6,010,969 | A  | * | 1/2000  | Vaartstra  | .................... | 438/758 |
| 6,613,924 | B1 | * | 9/2003  | Welch et al. | ................. | 556/110 |
| 2002/0041928 | A1 | * | 4/2002 | Budaragin | ................. | 427/229 |
| 2003/0116091 | A1 | * | 6/2003 | Grant et al. | ................ | 118/726 |

OTHER PUBLICATIONS

N. Kuzmina et al, "Silver pivalate as a new volatile precursor for thin film deposition", 1999, J. Phys. IV France, 9, 923-928.*

(Continued)

*Primary Examiner*—Timothy H Meeks
*Assistant Examiner*—Michael G Miller
(74) *Attorney, Agent, or Firm*—Crowell & Moring

(57) ABSTRACT

The invention relates to the deposition of thin silver films on various substrates, particularly superconductor substrates. The method consists of CVD deposition of silver on a substrate with the aid of a silver precursor solution. The silver precursor is an $RCO_2Ag$ silver carboxylate, wherein R is a linear or branched radical having 3-7 carbon atoms, used in the form of an organic liquid solution. The precursor concentration of the solution ranges from 0.01 to 0.6 mol/l. The organic liquid comprises an amine and/or a nitrile and, optionally, a solvent whose evaporation temperature is lower than the decomposition temperature of the precursor. The percentage by volume of the amine and/or nitrile in the organic liquid is more than 0.1%.

10 Claims, 2 Drawing Sheets

1 μm (a)

300 nm (b)

OTHER PUBLICATIONS

International Search Report mailed Sep. 3, 2004.

Kuzmina et al., "Silver Pivalate as a New Volatile Precursor for Thin Film Deposition", Journal De Physique IV, vol. 9, (1999), pp. 923-928.

Edwards et al., Aerosol-assisted Chemical Vapour Deposition (AACVD) of Silver Films from Triorganophosphine Adducts of Silver Carboxylates, Including the Structure of $[Ag(O_2CC_3F_7)(PPh_3)_2]$, Inorganica Chimica Acta, vol. 328, (2002) pp. 134-146.

Szlyk et al., "CVD of $Ag^1$ Complexes with Tertiary Phosphines and Perfluorinated Carboxylates —A New Class of Silver Precursors", Chemical Vapor Deposition, vol. 7, No. 3, (2001), pp. 111-116.

Paramonov et al., "MOCVD of Ag Thin Films", Journal De Physique IV: Proceedings, vol. 11, No. Pr3, (2001) pp. 645-652.

Szlyk et al., "$Au^1$ and $Ag^1$ Complexes with Tertiary Phosphines and Perfluorinated Carboxylates as Precursors for CVD of Gold and Silver", Chemical Vapor Deposition, vol. 6, No. 3, (2000), pp. 105-108.

* cited by examiner

1 µm  
(a)

300 nm  
(b)

1 µm  
(a)

200 nm  
(b)

PROCESS FOR THE DEPOSITION BY CVD OF A SILVER FILM ON A SUBSTRATE

FIELD OF ART

This invention relates to the deposition of thin silver films on various substrates, in particular on superconductive substrates.

BACKGROUND OF THE INVENTION

Silver is a metal that cannot be oxidized very well, is chemically fairly stable and has remarkable electrical properties. It is actually the most conductive metal that is known ($\rho=1.57\ \mu\Omega \cdot cm$). This is why its use in the form of a thin film offers many advantages in the field of high critical temperature Tc superconductors and in microelectronics. For high Tc superconductors, it has been shown that a metal layer and in particular a silver layer placed directly above or below the superconductive material significantly improved the service life of the device, cable or tape. In the field of microelectronics and flat screens (TFT (=thin film transistors) technology), the silver can be used in connection in the electronic components by replacing the aluminum or copper currently used.

Various processes for obtaining a silver deposit on a substrate exist.

One process that consists in performing a flash evaporation of silver pivalate in solid form has been described by S. Samilenkov et al. (Chem. Vap. Deposition, 2002, 8, No. 2, 74). However, the temperature that is required for evaporating the pivalate is at least equal to the decomposition temperature, which generates product losses and a poor yield.

Other compounds have been used for making Ag deposits by CVD. Thus, the use of (1,1,1,5,5,5-hexafluoro-2,4-pentanedionato) silver [bis-(trimethylsilyl)acetylene complexes has been described by Chi, Kai-Ming, et al. [Chem. Vap. Deposition (2001), 7, No. 3, 117-120]. The use of silver precursors of fluorinated β-dicetonate type for depositing silver films by CVD was described in particular in JP-08053470. U.S. Pat. No. 5,096,737 describes precursors for the deposition by CVD of films of various metals on a substrate. The precursors are of the (COD)M(I) (hfacac) type, whereby M is Cu, Ag, Rh, or Ir. However, in all of these processes, the use of fluorinated precursors runs the risk of introducing fluorine into the deposited silver layers.

Processes that use precursor solutions have been described in particular by J. P. Sénateur et al. ("Pulsed Injection MOCVD of Functional Electronic Oxides," Adv. Mater. Opt. Electron, 10, 155, 2000) and by H. Guillon et al. ("Injection MOCVD, Historical and State of the Art," Multimetox Network Newsletter, Issue 4, November 2001, p. 3). These techniques, however, can only be used for depositions of metals for which soluble precursors exist in solvents that can be used in CVD. The non-fluorinated silver complexes that are described in the prior art are then generally not very soluble in such solvents.

SUMMARY OF THE INVENTION

The object of this invention is to propose a process for deposition of a layer of silver on a substrate, by a suitable selection of reagents making possible the dissolution of a silver precursor in a solvent that can be used in CVD.

DETAILED DESCRIPTION OF THE INVENTION

Figure 1:
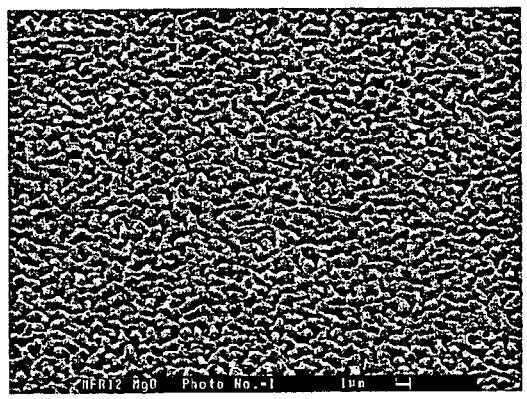
FIGS. 1A and 1B are Scanning Electronic Microscopy images, at different magnifications, of the surface of an Ag film deposited on a MgO monocrystalline substrate.
Figure 1:
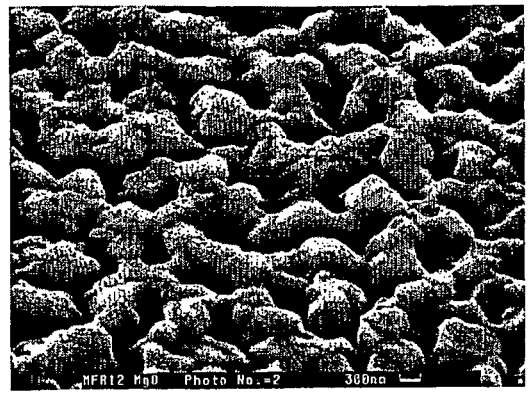

The process according to the invention for the deposition of an Ag film on a substrate consists in carrying out a deposition of silver by CVD on said substrate using a silver precursor solution. It is characterized in that:
  the silver precursor is a silver carboxylate $RCO_2Ag$ in which R is a linear or branched alkyl radical that has 3 to 7 carbon atoms, used in the form of a solution in an organic liquid;
  the concentration of precursor in the solution is between 0.01 and 0.6 mol/l;
  the organic liquid comprises an amine and/or a nitrile, and optionally a solvent whose evaporation temperature is less than the decomposition temperature of the precursor;
  the percentage by volume of the amine and/or the nitrile in the organic liquid is more than 0.1%.

Among the silver precursors, silver pivalate $(CH_3)_3$—C—$CO_2Ag$ is particularly preferred. Its decomposition temperature is 200° C.

Among the solvents, organic compounds that are liquid at ambient temperature and up to about 200° C. under normal pressure conditions are preferred. By way of example, it is possible to cite mesitylene, cyclohexane, xylene, toluene and n-octane.

The amine can be selected from among the primary, secondary or tertiary amines or among the polyamines. By way of example of monoamines, it is possible to cite n-hexylamine, isobutylamine, disec-butylamine, triethylamine, benzylamine, ethanolamine, and diisopropylamine. As examples of polyamines, it is possible to cite tetramethylethylenediamine.

The nitrile can be selected from among acetonitrile, valeronitrile, benzonitrile and propionitrile.

Among the organic liquids, quite particularly preferred are the mixtures of mesitylene with n-hexylamine, isobutylamine, diisopropylamine, triethylamine, acetonitrile, benzonitrile or valeronitrile; mixtures of propionitrile with hexylamine, isobutylamine, diisopropylamine or benzylamine; and mixtures of cyclohexane with hexylamine, isobutylamine, diisopropylamine or disec-butylamine.

The substrate on which the silver layer is deposited can be a superconductive high $T_c$ material, a dense ceramic or a porous ceramic, a thermoresistant polymer, a glass, MgO, $LaAlO_3$, Ni, Si, AsGa, InP, SiC and SiGe.

The process makes it possible to obtain silver deposits that have a thickness of up to 800 nm.

During the implementation of the process of depositing silver layers on a substrate, the composition that contains the silver precursor is sent into a evaporation device via which it is introduced into a high-temperature deposition chamber that contains the substrate on which the silver layer is to be deposited. Before its arrival in the evaporation device, the composition is generally kept in a tank at ambient temperature. The evaporation of the precursor composition can be carried out using various devices that are known to one skilled in the art. By way of preferred example, it is possible to cite the device that is described in Chem. Mat. 13, 3993 (2001), marketed by the Jipelec Company under the name of "InJect System for Injection and Evaporation of Pure Liquid Precursors or Precursors That are in the Form of Solutions." The temperature of the substrate to be coated and the temperature in the deposition chamber are between 200 and 450° C. The deposition chamber is under an oxygen atmosphere or under a hydrogen atmosphere and under a pressure that is lower than or equal to 15 Torr. Hydrogen or oxygen can be introduced into the deposition chamber in the form of a mixture with $N_2$ in which the $H_2/N_2$ or $O_2/N_2$ ratio by volume is less than or equal to 1.

A cold plasma optionally can be added around the substrate. When the deposition is carried out in the presence of plasma, it is sufficient that the substrate intended to receive the silver layer be kept at the same temperature that prevails in the evaporator. In the absence of plasma, it is necessary that said substrate be at a higher temperature than that of the evaporator, the temperature difference being at least equal to 20° C., preferably at least equal to 50° C., so as to avoid the deposition of silver on the reactor walls. The silver layer can be deposited on the substrate as a first layer or as the $n^{th}$ layer of metallization for the electronic devices that require several levels of metallization. The substrate can consist of one of the above-mentioned materials taken as is or else by one of these materials that can be one or more intermediate layers. By way of example of intermediate layers, it is possible to cite the metal films (for example an Ni film), an organic layer (for example a layer of a polymer material), or diffusion layers consisting of a material that is selected from among, for example, TiN, TiSiN, Ta, TaN, TaSiN, WN and WSiN.

The thickness of the silver layer that is deposited on the substrate depends on the concentration of the precursor composition, the flow rate of this composition during passage into the evaporation device, the evaporation period, respective temperatures in the reactor and on the substrate. In a general way, less concentrated compositions and/or lower flow rates are used to obtain thin layers, and more concentrated compositions and/or higher flow rates are used to obtain thick layers. A thin layer is generally defined as a layer that has a thickness that is less than or equal to 50 nm, a so-called nucleation layer. A thick layer is generally defined as a layer that has a thickness of between 50 nm and 1 µm.

To obtain thick layers, it is possible to use compositions in a solvent with a high dissolution coefficient at a precursor concentration that is close to saturation. The concentration should remain less than the saturation value so as to avoid the reprecipitation of the precursor that would have the effect of impeding the evaporation.

To obtain thin layers, it is possible to use the solvents in which the solubility of the precursor is lower. It is also possible to use a non-solvent organic liquid of the precursor that is chemically inert with regard to the precursor in order to dilute a precursor composition according to the invention.

The implementation of the process of the invention for the deposition of silver layers by CVD makes it possible to obtain good-quality silver layers that have a good adhesion to the substrate on which they are deposited.

This invention is illustrated in more detail by the following examples to which, however, they are not limited.

EXAMPLES

The examples were produced using a CVD reactor constituted by an above-mentioned "InJect" device, coupled to a vapor-phase chemical deposition chamber. Said "InJect" device comprises four primary parts: the tank for storing the solution, an injector that is connected by a feed line to the storage tank and that is equipped with an electronic control device, a line for feeding vector gas or neutral carrying gas (for example nitrogen) and an evaporator. The vapor-phase chemical deposition chamber, which contains the substrate to be coated, comprises heating means, an oxygen or hydrogen feed, and means for pumping and regulating the reduced pressure. The evaporator is connected to the vapor-phase chemical deposition chamber by a duct that is provided with heating means and that is kept at the same temperature as the evaporator. The vapor-phase chemical deposition chamber and the substrate to be coated that is placed there are kept at a temperature that is higher than that of the evaporator. The silver precursor solution is introduced into the tank that is kept at a pressure of 1 bar, then propelled from said tank thanks to the injector by a pressure difference in the evaporator that is kept under a vacuum. The injection flow rate is controlled by the injector that can be considered as a microsolenoid valve and that is controlled by a computer.

Example 1

Using a mesitylene-diisopropylamine solution that contains 1.25% by volume of diisopropylamine and 0.03 mol/l of silver pivalate, a silver film was deposited on a substrate placed within the deposition chamber at 250° C. under a pressure of 7.5 Torr. The pivalate solution is evaporated at 150° C. and sent into the evaporator with a flow rate of 16 ml/h, at the same time as the gaseous oxygen with a flow rate of 6 ml/min ($O_2/N_2$=0.075) and nitrogen with a flow rate of 80 ml/min.

Two samples were prepared according to this process, one with an MgO monocrystalline substrate, the other with an $LaAlO_3$ monocrystalline substrate.

For the two samples, a good-quality adhesive silver film with a thickness of 320-365 mm was obtained.

FIGS. 1a and 1b represent the Scanning Electronic Microscopy (SEM) pictures of the surface of the Ag deposit obtained on the MgO substrate at different magnifications.

Figure 2:
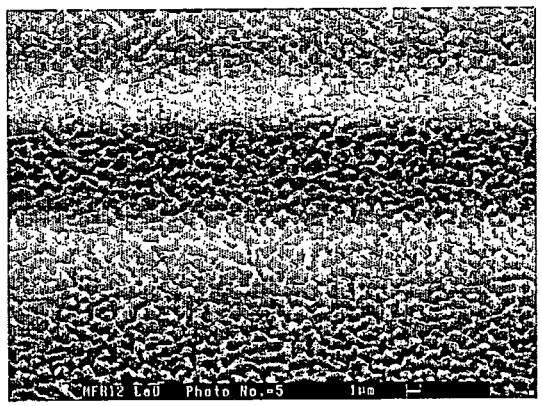
FIGS. 2A and 2B are Scanning Electronic Microscopy images, at different magnifications of the surface of an Ag film deposited on a $LaAlO_3$, monocrystalline substrate.
Figure 2:
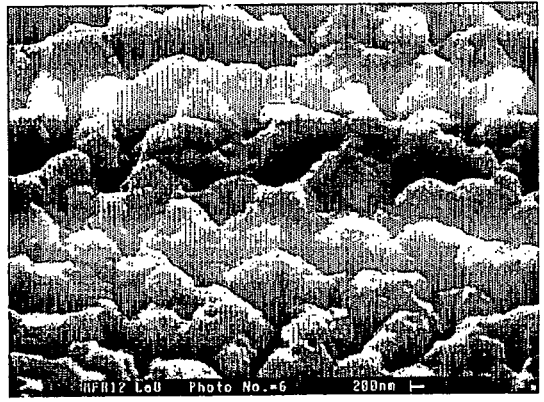

FIGS. 2a and 2b show the Scanning Electronic Microscopy (SEM) pictures of the surface of the Ag deposit obtained on the $LaAlO_3$ substrate at different magnifications.

Figure 3:
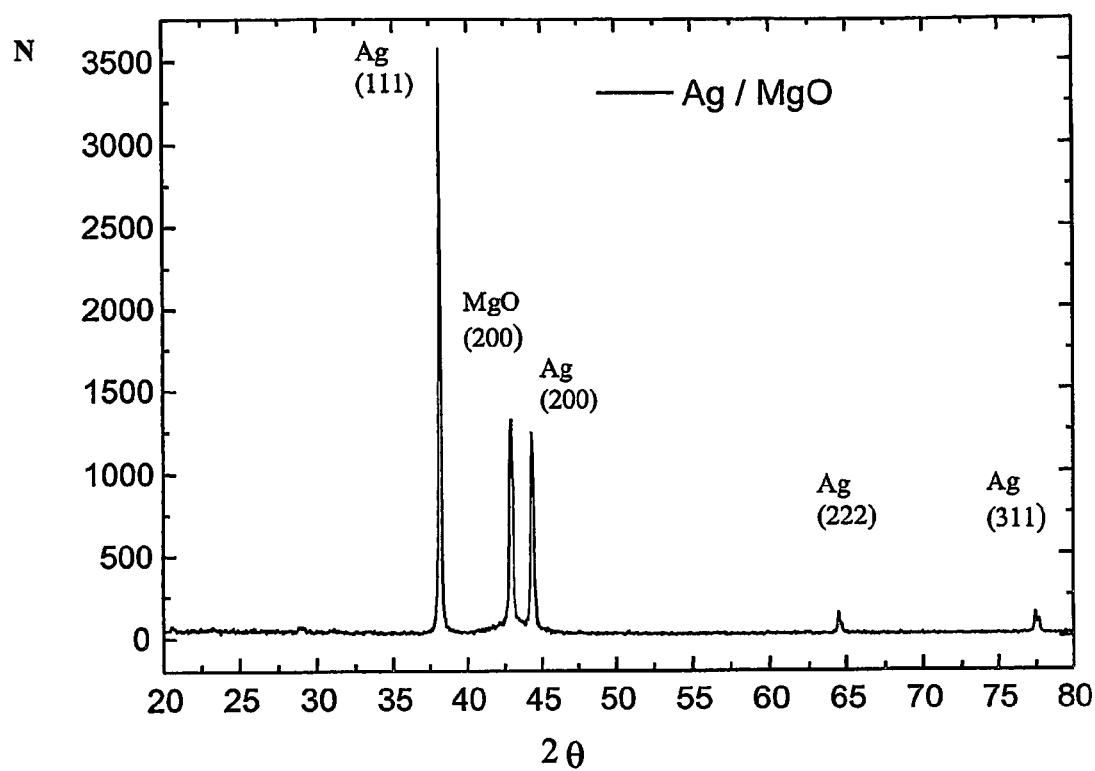
FIG. 3 is a diffraction diagram of the Ag film deposited on the MgO monocrystalline substrate shown in FIGS. 1A and 1B.

FIG. 3 shows the diffraction diagram of the RX of the deposit obtained on the MgO monocrystalline substrate. N represents the number of pulses in arbitrary units. 2θ shows the diffraction angle, in degrees.

Example 2

The operating procedure described in Example 1 was reproduced by replacing the diisopropylamine by n-hexylamine, respectively with an MgO monocrystalline substrate and with an $LaAlO_3$ monocrystalline substrate.

For the two samples, a good-quality adhesive silver film with a thickness of about 300 nm was obtained.

Example 3

Using a mesitylene diisopropylamine solution that contains 12.08% by volume of diisopropylamine and 0.05 mol/l of silver pivalate, a silver film was deposited on an Si monocrystalline substrate kept at 300° C. and placed in the deposition chamber at 150° C. under a pressure of 7.5 Torr. The pivalate solution was evaporated at 150° C. and sent into the evaporator with a flow rate of 8.5 ml/h, at the same time as the gaseous hydrogen with a flow rate of 30 ml/min ($H_2/N_2$=0.13) and nitrogen with a flow rate of 230 ml/min.

A silver film that has a thickness of 250 nm was deposited in 35 minutes, with a growth rate of 0.43 μm/h.

Example 4

Using a mesitylene-diisopropylamine solution containing 2.5% by volume of diisopropylamine and 0.06 mol/l of silver pivalate, a silver film was deposited on a substrate kept at 320° C. and placed in the deposition chamber at 150° C. under a pressure of 7.5 Torr. The pivalate solution was evaporated at 150° C. and sent into the evaporator with a flow rate of 37 ml/h, at the same time as the gaseous oxygen with a flow rate of 71 ml/min ($O_2/N_2$=0.8875) and nitrogen with an 80 ml/min flow rate.

Two samples were prepared according to this process, one with an Si monocrystalline substrate, the other with an $SiO_2$/Si substrate. A silver film that has a thickness of 150 mm was deposited in 8 minutes with a growth rate of 1.125 microns/h.

For the films obtained in Examples 2 to 4, the appearance of the Scanning Electronic Microscopy (SEM) pictures of the surface of the Ag deposit is identical to those that are reproduced in FIGS. 1a, 1b, 2a and 2b.

The invention claimed is:

1. A process for depositing a silver film on a substrate, comprising depositing silver on the substrate by chemical vapor deposition, in an oxygen atmosphere or in a hydrogen atmosphere, of a solution comprising a silver precursor, an amine and/or a nitrile, and a solvent, wherein:

the silver precursor is a silver carboxylate $RCO_2Ag$ in which R is a linear or branched alkyl radical that has 3 to 7 carbon atoms;

the concentration of the silver precursor in the solution is between 0.01 and 0.6 mol/l;

optionally the solvent has an evaporation temperature that is less than the decomposition temperature of the silver precursor; and the percentage by volume of the amine and/or the nitrile in the solvent is more than 0.1%.

2. The process according to claim 1, wherein the silver precursor is the silver pivalate $(CH_3)_3$—C—$CO_2Ag$.

3. The process according to claim 1, wherein the solvent is an organic compound that is liquid at ambient temperature and up to about 200° C. under normal pressure conditions.

4. The process according to claim 3, wherein the solvent is selected from the group consisting of mesitylene, cyclohexane, xylene, toluene and n-octane.

5. The process according to claim 1, wherein the amine is a monoamine that is selected from the group consisting of n-hexylamine, isobutylamine, disec-butylamine, triethylamine, benzylamine, ethanolamine and diisopropylamine.

6. The process according to claim 1, wherein the amine is a polyamine.

7. The process according to claim 1, wherein the nitrile is selected from the group consisting of acetonitrile, valeronitrile, benzonitrile and propionitrile.

8. The process according to claim 1, wherein the substrate is formed by a material that is selected from the group consisting of superconductive high $T_c$ materials, ceramics, thermoresistant polymers, glasses, MgO, $LaAlO_3$, Ni, Si, AsGa, InP, SiC and SiGe.

9. The process according to claim 1, wherein the temperature of the substrate on which silver is to be deposited is between 200 and 450° C.

10. The process according to claim 1, wherein silver is deposited on the substrate in the presence of a cold plasma.

* * * * *